United States Patent [19]

Ariizumi et al.

[11] Patent Number: 4,539,490
[45] Date of Patent: Sep. 3, 1985

[54] CHARGE PUMP SUBSTRATE BIAS WITH ANTIPARASITIC GUARD RING

[75] Inventors: Shoji Ariizumi, Tokyo; Makoto Segawa, Yokohama, both of Japan

[73] Assignee: Tokyo Shibarua Denki Kabushiki Kaisha, Japan

[21] Appl. No.: 494,266

[22] Filed: May 13, 1985

Related U.S. Application Data

[63] Continuation of Ser. No. 212,544, Dec. 3, 1980.

[30] Foreign Application Priority Data

Dec. 8, 1979 [JP] Japan ................................ 54-159487
Dec. 8, 1979 [JP] Japan ................................ 54-159488

[51] Int. Cl.³ ..................... H01L 27/04; G11C 11/40
[52] U.S. Cl. ........................... 307/296 R; 357/23.6; 357/41; 357/51; 357/75; 357/86
[58] Field of Search .................. 357/41, 23 C, 42, 86; 307/296, 297, 304

[56] References Cited

U.S. PATENT DOCUMENTS

| | | | |
|---|---|---|---|
| 3,806,741 | 4/1974 | Smith | 307/304 |
| 3,845,331 | 10/1974 | Luscher | 357/23 C |
| 4,044,373 | 8/1977 | Nomiya et al. | 357/41 |
| 4,115,794 | 9/1978 | De La Moneda | 357/23 C |
| 4,141,027 | 2/1979 | Baldwin et al. | 357/23 C |
| 4,163,245 | 7/1979 | Kinoshita | 357/23 C |
| 4,168,507 | 9/1979 | Yester, Jr. | 357/51 |
| 4,249,196 | 2/1981 | Durney et al. | 357/51 |
| 4,255,756 | 3/1981 | Shimotori et al. | 357/23 C |
| 4,339,766 | 7/1982 | Rao | 357/41 |

*Primary Examiner*—William D. Larkins
*Attorney, Agent, or Firm*—Finnegan, Henderson, Farabow, Garrett & Dunner

[57] ABSTRACT

The region constituting the rectify-charge pump circuit of a self substrate bias circuit is surrounded by a capacitive region, and the fluctuated minority carriers induced in this region are absorbed.

3 Claims, 7 Drawing Figures

CHARGE PUMP SUBSTRATE BIAS WITH ANTIPARASITIC GUARD RING

This is a continuation of Ser. No. 212, 544 filed Dec. 3, 1980.

BACKGROUND OF THE INVENTION

The present invention relates to an MOS circuit and, more particularly, to a semiconductor device having a self substrate bias circuit.

MOS semiconductor integrated circuit devices are being developed for higher packing density, higher speed, and lower power consumption. As a means to achieve these objects, it is generally known to apply a DC bias to the substrate. When DC bias is applied to the substrate of an integrated circuit device, the coupling capacity is reduced, the punch-through voltage is improved, the field leakage is reduced, the noise margin of the input and output waveforms is improved, and the noise margin of the internal circuit is improved. For applying a bias to the substrate, it is generally necessary to apply a DC voltage from outside the integrated circuit device, so an extra pin for connection to the outside is required. The increase in the number of pins for connection to the outside is disadvantageous for integrated circuit devices from the perspective of the manufacturing cost. Thus, efforts have been made to reduce the number of such pins. It is also undesirable from the perspective of the additional power requirement for the system.

A self substrate bias circuit of so-called on-chip type has recently been developed in which the other circuits are formed on a single substrate together with a self substrate bias circuit for generating a DC bias to be applied to the substrate. In such an on-chip type self substrate bias circuit, a distributed capacitor connected between the substrate and a reference voltage source is utilized, and a voltage corresponding to the charge stored in the distributed capacitor becomes the bias voltage to be applied to the substrate. In a conventional self substrate bias circuit, the distributed capacitor is formed by a diffusion region connected to the reference voltage source. Since the area of the diffusion region is limited, a large amount of charge cannot be stored in the distributed capacitor. As a result, the stability of the voltage generated by the self substrate bias circuit is inferior to that obtained with a bias circuit in which a bias voltage is supplied from the outside. On the other hand, when the diffusion area is enlarged, the junction leakage between the substrate and the reference power source increases.

As a capacitor for storing electrons transferred from the self substrate bias circuit, one with a sandwich structure having a pair of conductors with an insulation layer interposed therebetween provides the best storing efficiency. It is possible to form the capacitor of sandwich structure on the same single substrate on which is formed the self substrate bias circuit. However, when forming such a capacitor on the same substrate with the self substrate bias circuit, the chip size becomes extremely large due to the presence of this capacitor, resulting in a higher cost of the device. Further, if a pinhole is formed in the insulation layer of the capacitor of the sandwich structure, not only the capacitor becomes unusable, but the device as well, resulting in increased cost.

SUMMARY OF THE INVENTION

It is the primary object of the present invention to provide a semiconductor device with which the bias voltage generated by a self substrate bias circuit is stable.

To the above and other ends, the present invention comprises a semiconductor substrate of a first conductivity type, an oscillator fabricated on the semiconductor substrate for generating pulse signals, a rectify-charge pump circuit fabricated on the semiconductor substrate and including a coupling capacitor connected to the oscillator to be supplied with the pulse signals, a first field effect transistor connected between the capacitor and a reference voltage source, and a second field effect transistor connected between the capacitor and the substrate, and a capacitor region of a second conductivity type formed in the semiconductor substrate and connected to the reference voltage source for absorbing fluctuated minority carriers generated from the rectify-charge pump circuit.

In another aspect of the present invention, there is also provided a semiconductor device with a distributed capacitor of larger capacity for stabilizing the bias voltage of the self substrate bias circuit.

DETAILED DESCRIPTION OF THE INVENTION

Figure 1:
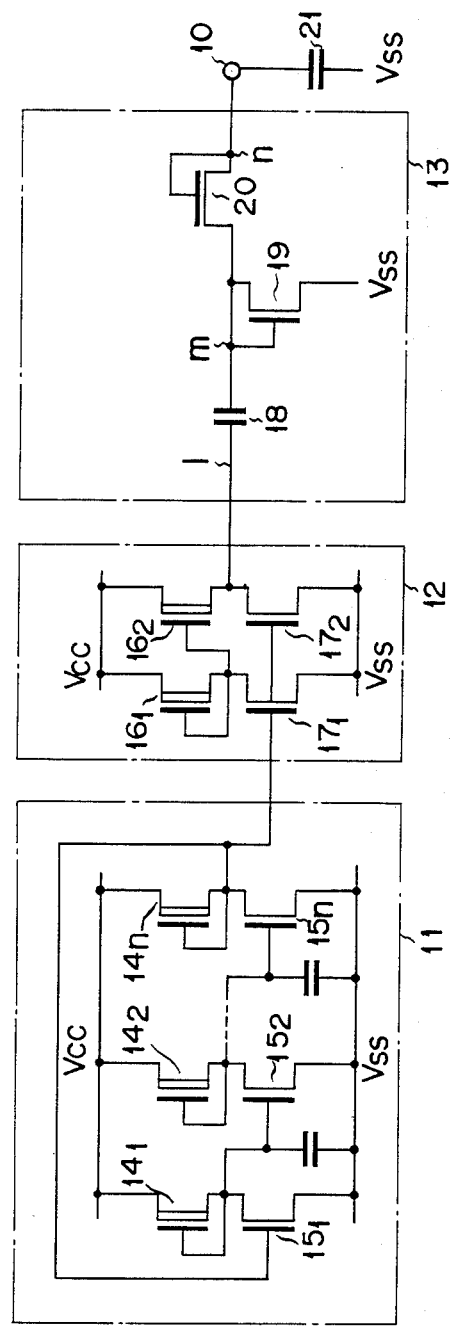
FIG. 1 is a view illustrating the self substrate bias circuit of the present invention.

A self substrate bias circuit as shown in FIG. 1 comprises a ring oscillator 11, a buffer circuit 12, and a rectify-charge pump circuit 13.

The ring oscillator 11 comprises inverters of n stages (where n is an odd number) inserted between the point where Vcc (positive voltage) is applied and the point where Vss (reference voltage=ground voltage) is applied, and generates pulse signals of 1 MHz to 20 MHz. These inverters comprise transistors $14_1, 14_2, \ldots 14_n$ of the depletion type and transistors $15_1, 15_2, \ldots 15_n$ of the enhancement type.

The buffer circuit 12 comprises a push-pull circuit having two stages of inverters inserted between the point where Vcc is applied and the point where Vss is applied, and it shapes the waveforms of the output pulses of the ring oscillator 11. The two stages of inverters comprise transistors $16_1$ and $16_2$ of the depletion type and transistors $17_1$ and $17_2$ of the enhancement type. The pulse signals whose waveforms are shaped by the buffer circuit 12 are supplied to the rectify-charge pump circuit 13.

At the rectify-charge pump circuit 13, the supplied pulse signals are supplied to one end of a coupling capacitor 18. The other end of the coupling capacitor 18 is connected to the gate and the drain of an enhancement type transistor 19 as well as to the source of an enhancement type transistor 20. The gate and the drain of the transistor 20 are commonly connected, and this node is connected to a substrate 10. The pulse signal supplied to the one end of the coupling capacitor 18 is integrated by a kind of integrating circuit comprising the coupling capacitor 18 and the transistor 19 or the transistor 20. A distributed capacitor 21 of the substrate is connected between the substrate 10 and the point where Vss is applied in an equivalent circuit.

Figure 2:
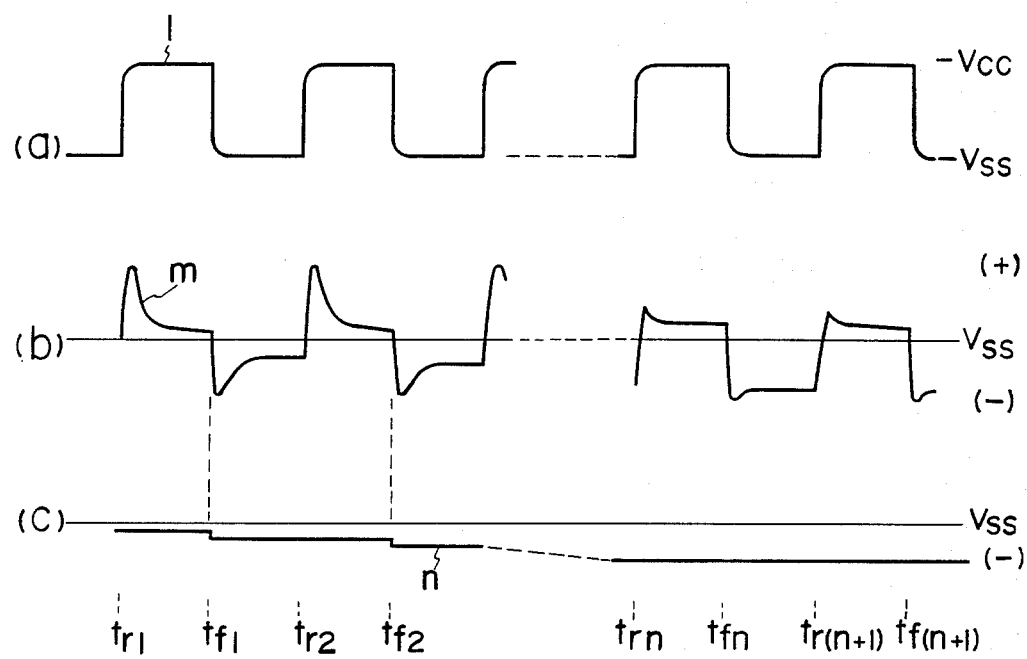
FIG. 2 is a timing chart for explaining the operation of the self substrate bias circuit of FIG. 1.

Waveforms a to c of FIG. 2 respectively show the changes in the potential at a point 1 of the self substrate bias circuit, i.e., the input side of the pulse signal of the coupling capacitor 18, a point m, i.e., the output side of the coupling capacitor 18, and a point n, i.e., the node of the gate and the drain of the transistor 20. When the potential at the point m capacitively coupled to the point 1 by the coupling capacitor 18 rises to the positive side, that is, at the timings $t_{r1}, t_{r2}, \ldots t_{rn}, t_{r(n+1)}$ of FIG. 2, the transistor 19 is on and the transistor 20 is off. Electrons are transfered from the point where Vss is applied to the point m through the transistor 19, which is on. This is equivalent to saying that a current flows to the point where Vss is applied from the point m through the transistor 19 so that the electrons are stored at the point m. When the potential at the point m capacitively coupled to the point 1 by the coupling capacitor 18 falls to the negative side, that is, at the timings $t_{f1}, t_{f2}, \ldots t_{fn}, t_{f(n+1)}$ of FIG. 2, the transistor 20 turns on and the transistor 19 turns off. A current flows from the point n to the point m shown in FIG. 1 through the transistor 20. Thus, the electrons stored at the point m are transferred to the substrate 10. The transferred electrons are stored at the distributed capacitor 21 connected between the substrate 10 and the point where Vss is applied. By the repetition of such operations, the amount of charge stored at the distributed capacitor 21 gradually increases so that the voltage at the point n connected to the substrate 10 is reduced toward a negative value of great magnitude as shown by the waveform c of FIG. 2. As a result, a negative bias is applied to the substrate 10. Using such a self substrate bias circuit, the number of pins for connection to the outside of the integrated circuit device may be reduced by one, and variations in the threshold voltage of the transistor due to variations in the manufacturing process may be reduced to the minimum.

Figure 3:
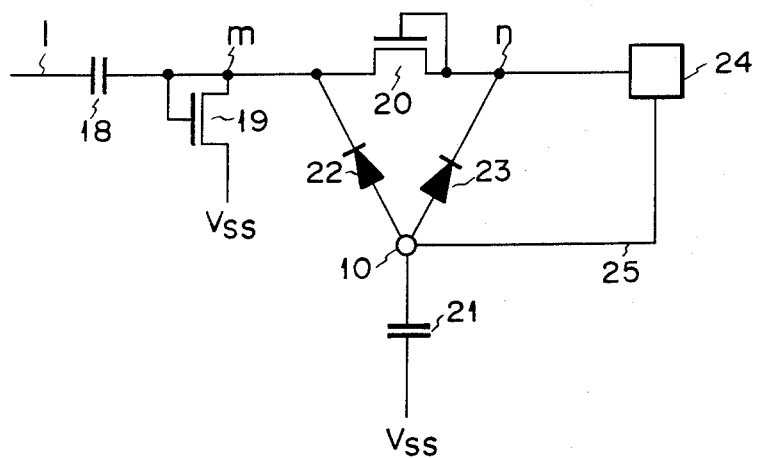
FIG. 3 is a circuit diagram of the rectify-charge pump of the self substrate bias circuit of FIG. 1.

FIG. 3 is a view illustrating the detailed circuit construction of the rectify-charge pump circuit 13. The cathode of a diode 22 is connected to the point m. The diode 22 has as its cathode region the drain or the source diffusion regions (n-type) of the transistors 19 and 20, and as its anode, the substrate (p-type). The cathode of a diode 23 is connected to the point n to which the gate and the drain of the transistor 20 are connected. The diode 23 has as its cathode region the drain diffusion region (n-type) of the transistor 20, and as its anode region, the substrate (p-type). In FIG. 3, numeral 24 indicates a bonding pad connected to the point n, and 25 indicates a bonding wire for connecting the bonding pad with the substrate 10. Some of the electrons stored at the point m are transferred to the substrate 10 through the two diodes 22 and 23 at the timings $t_{f1}, t_{f2}, \ldots t_{fn}, t_{f(n+1)}$ when the voltage across the point m takes the negative value of greatest magnitude during each period shown in FIG. 2. Then, the electron density is distributed about the rectify-charge pump circuit 13, and the distribution of the substrate level is expanded in waveform.

Figure 4:
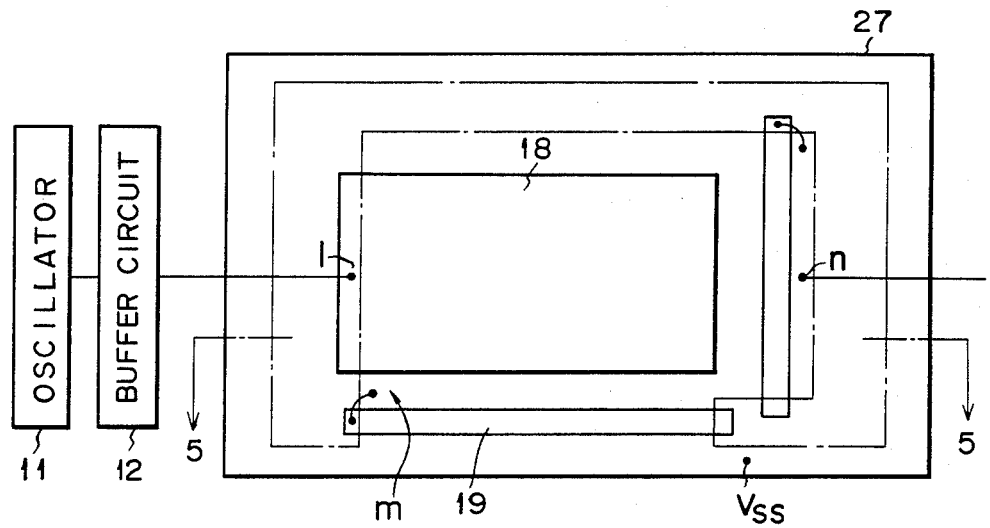
FIG. 4 is a plan view of the substrate of a semiconductor device according to one embodiment of the present invention.
Figure 5:
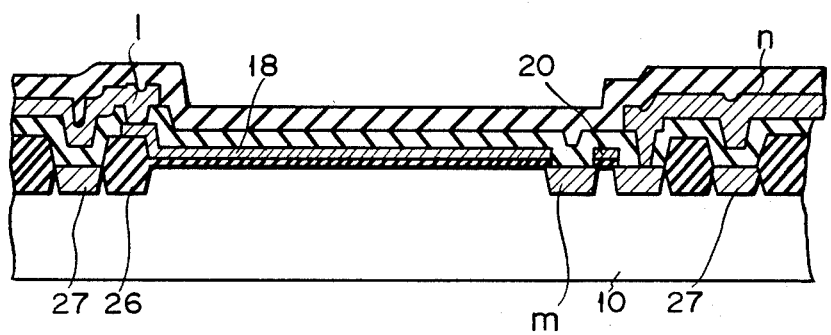
FIG. 5 is a sectional view along the line 5—5 of the substrate shown in FIG. 4.

FIG. 4 shows the IC pattern of the rectify-charge pump circuit 13, and FIG. 5 is a sectional view along the line 5—5 of FIG. 4. The rectify-charge pump circuit 13 is formed on the substrate 10 and is surrounded by an $n^{30}$-type diffusion region 27 with a predetermined width. The diffusion region 27 functions as a capacitive region as it is connected to the point where Vss is applied. Referring to FIG. 5, the substrate has a specific resistance of 50 $\Omega$.cm and, a field oxide layer 26 has a thickness of 1 $\mu$m. The diffusion region 27 has a diffusion depth xj of 0.5 $\mu$m when arsenic is used as the diffusion source, and 1.5 $\mu$m when phosphorus is used. Since it is preferable that the diffusion region 27 be deep, phosphorus is used as the diffusion source in practice.

As has been described hereinbefore, the electrons transferred to the substrate 10 are mainly stored in the capacitance between the substrate 10 and the point where Vss is applied. Thus, the electrons are trapped by the diffusion region 27 when the diffusion region 27, kept at the potential Vss, is formed around the rectify-charge pump circuit 13. Thus, the expansion of the waveform distribution of the electrons may be suppressed by the diffusion region 27, so that the conventional influence of the self substrate bias circuit on other circuits, for example, variations in the threshold voltage of the transistor, the generation of noise and so on, may be prevented. Further, by connecting the diffusion region 27 to the point where Vss is applied, the value of the distributed capacitor 21 increases so that the voltage induced by the self substrate bias circuit may be made stabler than in conventional cases. A semiconductor device with higher reliability may thus be provided.

Although the diffusion region 27 is formed as a capacitive region for preventing waveform distribution of the electrons in the above embodiment, it may be replaced with a capacitive region formed in a gate polysilicon layer whose gate is kept at Vss potential, a field polysilicon layer kept at Vss potential, an aluminum wiring layer on the surface of the substrate and so on. However, since the injected electrons are distributed three-dimensionally within the substrate 10, it is most reasonable to form a capacitive region with a diffusion region formed from the surface of the substrate toward the inside thereof for preventing waveform distribution of the electrons.

Although the capacitive region of the diffusion region or the like has been described as surrounding the rectify-charge pump circuit 13, this capacitive region may alternatively be formed only between the rectify-charge pump circuit 13 and those external circuits which may be easily affected by waveform distribution of the electrons. The reliability may be particularly improved by forming a capacitive region kept at the Vss potential for the circuit which is particularly subject to the influence of the distribution of the electrons. Although description has been made with particular reference to a case where the substrate 10 was of p-type in the above embodiment, it is to be understood that it may be n-type.

Figure 6:
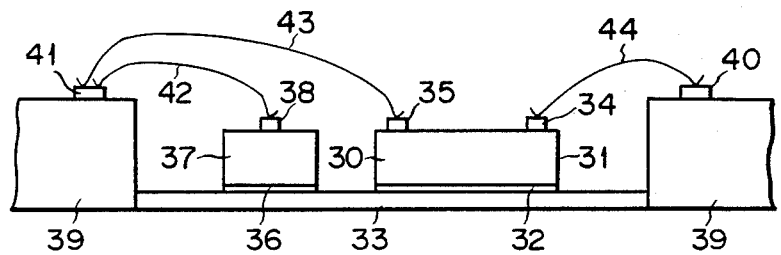
FIG. 6 is a schematic side view of a semiconductor device according to another embodiment of the present invention.

Another embodiment of the present invention will now be described with reference to FIG. 6.

In this embodiment, a semiconductor chip 31 on which is formed a self substrate bias circuit as shown in FIG. 1 is mounted on a conductive bed 33 by a conductive mounting material 32. An electrode 34 to which a positive voltage Vcc is applied, and an electrode 35 to which a ground voltage Vss is applied, are formed on the top surface of the semiconductor chip 31. One electrode of a capacitor chip 37 is mounted to the conductive bed 33 by a conductive mounting material 36. The other electrode 38 is mounted on the top surface of the capacitor chip 37. A terminal 40 to which Vcc is supplied, and a terminal 41 to which Vss is supplied, are formed on a package 39 of ceramic material. The electrode 38 of the capacitor chip 37 and the electrode 35 of the semiconductor chip 31 are connected with the terminal 41 by bonding wires 42 and 43, respectively. The electrode 34 of the semiconductor chip 31 is connected to a terminal 40 by a bonding wire 44.

Figure 7:
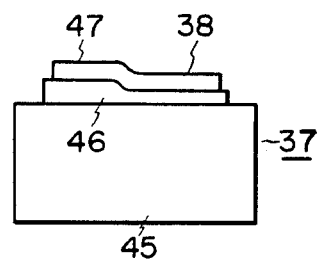
FIG. 7 is a side view of the capacitor chip of the semiconductor device of FIG. 6.

FIG. 7 is a side view illustrating the details of the capacitor chip 37. In the capacitor chip 37, an insulation layer 46 of $SiO_2$ is formed on one surface of a silicon substrate 45, and the electrode 38 is formed on the surface of the insulation layer 46. The thickness of the insulation layer 46 is partially made thick. The electrode on the surface of the thickened part forms a bonding pad 47, and the bonding wire 42 is bonded to this. The other surface of the silicon substrate 45 is mounted to the bed 33 through the mounting material 36 as the other electrode.

With such a construction, the capacitance between a substrate 30 of the semiconductor chip 31 and the point where Vss is applied is extremely increased, so that the negative bias applied to the substrate 30 of the semiconductor chip 31 becomes extremly stable. Further, since the semiconductor chip and the capacitor chip 37 are separate, the cost of the capacitor may be reduced as compared with the case wherein they are formed on the same substrate. Even when a defect such as a pin hole is present in the insulation layer 46 of the capacitive chip 37, the capacitive chip 37 alone may be replaced with a new one, providing an economical semiconductor device.

A silicon substrate with an insulation layer and electrodes formed thereon was used as the capacitor chip in the above embodiment. However, a KOV substrate of an alloy of Ni and Co may be used in place of the silicon substrate. Since the KOV substrate is less expensive than the silicon substrate, a more economical semiconductor device may be provided.

In summary, a bias voltage to be applied to a substrate on which is formed a self substrate bias circuit may be made extremely stable by at least connecting a guard ring region between the self substrate bias circuit and the external circuit, or by connecting the capacitor chip to the chip of the self substrate bias circuit.

What we claim is:

1. A self-substrate bias circuit semiconductor device comprising:
   a semiconductor substrate of a first conductivity type;
   an oscillator fabricated on said semiconductor substrate for generating pulse signals;
   a rectify-charge pump circuit section fabricated on said semiconductor substrate and including a coupling capacitor connected to said oscillator to be supplied with pulse signals, a first field effect transistor connected between said capacitor and a reference voltage source, and a second field effect transistor connected between said capacitor of said substrate and said substrate; and
   a semiconductor region of a second conductivity type formed in said semiconductor substrate to surround said rectify-charge pump circuit section and to function as a capacitive region and a source region for said first field effect transistor, said semiconductor region being connected to said reference voltage source for functioning as a capacitive guard ring that absorbs fluctuating minority carriers generated from said rectify-charge pump circuit.

2. A semiconductor device according to claim 1 wherein said semiconductor region is formed by diffusing phosphorus into said semiconductor substrate.

3. A semiconductor device according to claim 2 wherein said semiconductor substrate has a specific resistance of 50 Ω.cm and said semiconductor region a diffusion depth of 1.5 um.

* * * * *

UNITED STATES PATENT AND TRADEMARK OFFICE
CERTIFICATE OF CORRECTION

PATENT NO. : 4,539,490

DATED : September 3, 1985

INVENTOR(S) : Shoji Ariizumi et al.

It is certified that error appears in the above-identified patent and that said Letters Patent is hereby corrected as shown below:

Please make the following changes on the cover page:

[22] should be -- May 13, 1983 -- not "May 13, 1985";

[73] should be -- Tokyo Shibaura Denki Kabushiki Kaisha -- not "Tokyo Shibarua Denki Kabushiki Kaisha"; and

[63] Please indicate the abandonment of Serial No. 212,544, December 3, 1980.

Signed and Sealed this

Fourteenth Day of January 1986

[SEAL]

Attest:

DONALD J. QUIGG

Attesting Officer

Commissioner of Patents and Trademarks